US007761275B2

(12) United States Patent
Chopra et al.

(10) Patent No.: US 7,761,275 B2
(45) Date of Patent: Jul. 20, 2010

(54) SYNTHESIZING CURRENT SOURCE DRIVER MODEL FOR ANALYSIS OF CELL CHARACTERISTICS

(75) Inventors: Kaviraj S. Chopra, Ann Arbor, MI (US); Chandramouli V. Kashyap, Round Rock, TX (US); Haihua Su, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1247 days.

(21) Appl. No.: 11/311,038

(22) Filed: Dec. 19, 2005

(65) Prior Publication Data

US 2007/0143719 A1 Jun. 21, 2007

(51) Int. Cl.
*G06G 7/62* (2006.01)
(52) U.S. Cl. .............................. 703/14; 703/13; 703/15; 716/4; 716/5; 716/6
(58) Field of Classification Search ............. 703/13–15; 716/1, 4–6
See application file for complete search history.

(56) References Cited

U.S. PATENT DOCUMENTS 6,721,929 B2 * 4/2004 Li et al. .......................... 716/6
7,444,605 B2 * 10/2008 Wang et al. ..................... 716/5

OTHER PUBLICATIONS

Margaret E. Clarke et al., "Look-up Table Models of Power Devices for use in Circuit Simulators", 1994, The Institution of Electrical Engineers, pp. 9/1-9/4.*
Walt Jung, "Op-Amp Audio, Realizing High Performance: Bandwidth Limitations", Dec. 1, 1998, retrieved from electronicdesign.com on Apr. 29, 2009.*
Richard Goering, "New Synopsys timing model challenges Cadence's ECSM", Oct. 26, 2004, retrieved from www.eetasia.com on Apr. 29, 2009.*
"Bipolar junction transistor", Wikipedia.org, retrieved from Wikipedia.org on Nov. 6, 2009.*
"MOSFET", Wikipedia.org, retrieved from Wikipedia.org on Nov. 6, 2009.*

* cited by examiner

*Primary Examiner*—Jason Proctor
(74) *Attorney, Agent, or Firm*—Scully, Scott, Murphy & Presser, P.C.; H. Daniel Schnurmann

(57) ABSTRACT

A method for performing an analysis of at least one logic stage in a netlist, which include one or more drivers, is provided. The method includes operations of generating at least one look-up table for an output transient current to be based on values of input and output voltages using data available from a cell library; synthesizing analytically at least one current source model, which includes a DC component and a plurality of parasitic capacitances, using the look-up table; simulating the logic stage using the current source model to model the drivers; and obtaining characteristics of the simulated logic stage. A system and a machine-readable medium for performing the method are also provided.

20 Claims, 13 Drawing Sheets

SYNTHESIZING CURRENT SOURCE DRIVER MODEL FOR ANALYSIS OF CELL CHARACTERISTICS

FIELD OF THE INVENTION

The present invention relates to performance analysis of logic stages in a netlist of a very large scale integrated (VLSI) chip design. In particular, it relates to synthesizing current source models used in analysis of timing and noise characteristics of logic stages.

BACKGROUND OF THE INVENTION

Static timing analyzers are widely used as tools for optimization and validation of designs of very large scale integrated (VLSI) chips. For example, a VLSI chip design, typically represented by a netlist, may be partitioned into a plurality of successive logic stages of a combinational logic. A logic stage may include, for example, one or more different driver gates such as, for example, a nonlinear driver gate, and one or more interconnect loads. Analysis of a logic stage may be performed or conducted by modeling or simulating nonlinear driver gates inside a logic stage using, for example, simplified linear driver models or current source models. A linear driver model may be generated or created, in some static timing analyzers for example, by following a C-effective procedure as is known in the art.

With the advance of electronic design and aggressive device scaling, electrical characteristics of electronic devices, such as nanometer transistors, are increasingly becoming nonlinear due to increased short channel effects, for example. In addition, ratios of resistance of a typical wire versus a driver also increase proportionally with the scaling. It is becoming increasingly difficult to accurately capture output waveforms of a logic stage at a driver output using a traditional C-effective based linear driver model.

In a netlist, performance of a logic stage may be affected by a neighboring logic stage due to, for example, coupling noises. A logic stage receiving a noise from one or more neighboring logic stages may be a victim stage, referred to herein as a victim or victim stage or victim cell. A logic stage that couples a noise to a neighboring logic stage may be an aggressor stage, referred to herein as an aggressor or aggressor stage or aggressor cell. Switching a driver inside an aggressor stage may cause a noise or a noise glitch being coupled to a victim stage. A noise may usually cause changes in delay of the victim stage which is simultaneously switching. In this case the noise may be known as a delay noise. If a victim stage is quiet, that is the victim stage is not switching, the noise from a switching aggressor stage may potentially propagate through the victim stage, and latch into, for example, a storage element of the victim stage causing a functional failure of the victim stage. A noise causing a functional failure of the victim stage may be known as a functional noise.

Noises or noise glitches that cause functional failure of a victim stage may be modeled, for example, following the C-effective procedure as well. The C-effective procedure based modeling uses two parameters to model the peak and area of a noise, and therefore may be inherently inadequate to capture other characteristics of the noise such as, for example, asymmetric waveforms of the noise. In addition, the C-effective procedure based modeling may not be able to model the driver gates accurately due to increased nonlinearities of the drivers. Furthermore, the C-effective procedure based modeling may require other procedures for performing three-dimensional gate characterization which may include, for example, two glitch parameters and one parameter for output capacitance.

For alignment analysis between an aggressor stage and a victim stage, it was proposed in the art that an approach based on linear driver models may be used. This approach requires the creation of a pre-characterized four-dimensional look-up table and is not based on cell libraries currently existing such as current industry standard cell libraries. Here, the term of alignment refers to a condition, between a victim stage and an aggressor stage, that causes delays or delay noises at the output of the victim stage. A worst-case alignment may be a condition where the victim stage experiences a maximum delay at a driver output. It has been observed that the alignment may be dependent on edge rate, noise width, noise height, and receiver load of the victim cell.

It was also proposed in the art that a nonlinear DC current source model may be used for analyzing timing and noise characteristics of a logic stage. The nonlinear DC current source model may be dependent from input and output voltages. Using this nonlinear DC current source model, a two-dimensional look-up table may be created and augmented with a Miller capacitance ($C_m$) and an output capacitance ($C_o$) to capture effects of parasitic capacitances. It was shown that using this DC current source model, a fast and relatively accurate analysis may be obtained for arbitrary input waveforms and arbitrary output loads. Some fixed time-step was used for nonlinear simulation of drivers and recursive convolution was used for simulating interconnects. However, this method requires a new library with new characterization data format in order to generate the look-up table. In addition, this method does not address the issue of delay noise analysis.

Another method was presented in the art for calculating changes in delay due to coupling noise at the output of a receiver stage, i.e., victim stage, using nonlinear current source driver models. According to this method, a worst case alignment search may be formulated as a constrained nonlinear optimization problem with an objective to identify relatively large changes, for example, maximum changes, in delay at the output of the receiver stage. This method requires using nonlinear simulation to evaluate noisy responses at the receiver output in order to find an alignment. For a single timing stage, the process of finding an alignment may require several iterations of the nonlinear simulation. As a result, this nonlinear programming (NLP) based method may require significant runtime and may impact the overall efficiency of a static timing analyzer adopting this method. In addition, existing library characterization flow and library formats may also need to be modified in order to obtain a DC current source model explicitly from the SPICE characterization. Such changes are not practically viable since it may require drastic changes in the design and optimization flow.

Responding to the need as described above for modeling nonlinear drivers in a logic stage, the electronic design automation (EDA) industry added new gate characterization data to the standard library format, for example, an effective current source model (ECSM) and a composite current source model (CCSM). Similar to the existing library characterization flow, a gate in ECSM is characterized for a range of input slews and output load capacitances and for each input slew and output load capacitance $C_l$, a piecewise linear description of the output voltage waveform is provided. ECSM look-up tables are a simple and incremental extension to the traditional delay and output slew look-up tables in a cell library. Similarly, CCSM lookup tables include piecewise linear output current waveforms instead of the output voltage waveforms in ECSM.

BRIEF DESCRIPTION OF THE DRAWINGS

The present invention will be understood and appreciated more fully from the following detailed description of the invention, taken in conjunction with the accompanying drawings of which.

Figure 1:
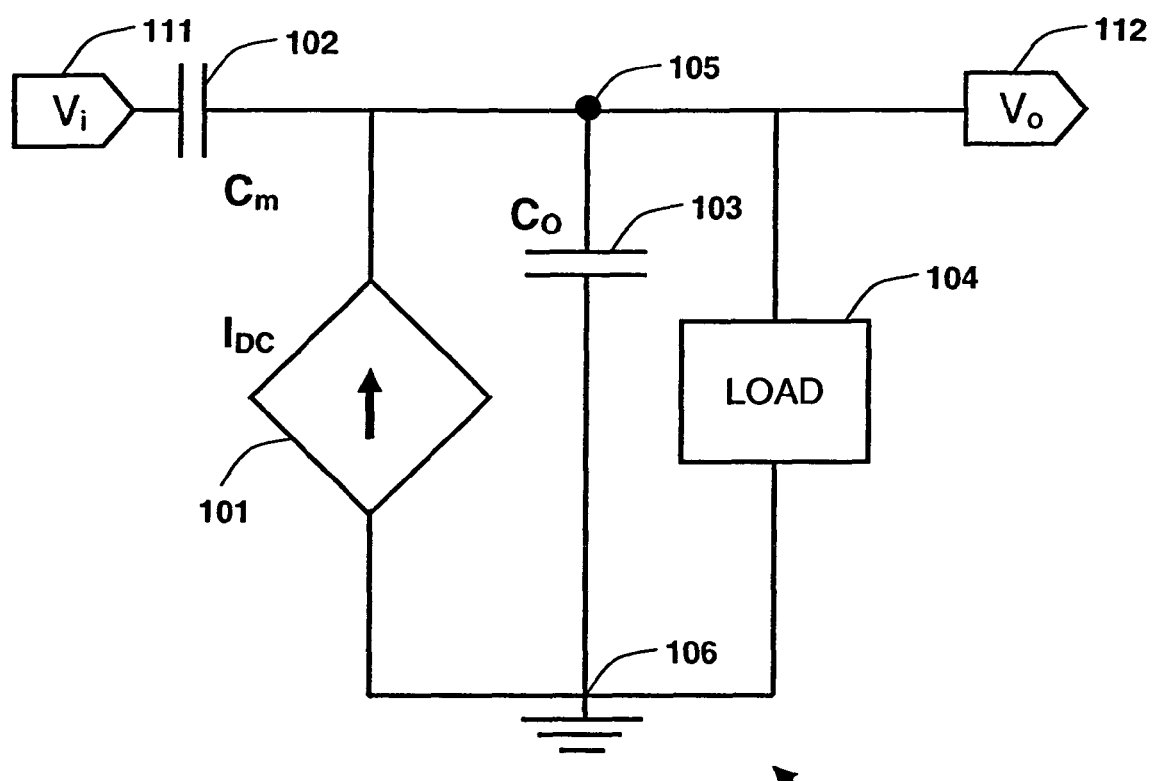
FIG. 1 is a simplified diagram illustration of a current source model as is known in the art.

It will be appreciated that for simplicity and clarity of illustration, elements shown in the drawings have not necessarily been drawn to scale. For example, the dimensions of some of the elements may be exaggerated relative to other elements for clarity.

SUMMARY OF THE INVENTION

Embodiment of the invention may provide a method for synthesizing current source models using data available from a cell library. The current source models may be, for example, current source driver models synthesized from data conforming to, for example, CCSM and/or ECSM format. According to one embodiment of the method, analytical equations or expressions, for example, a hyperbolic tangent function, may be used to represent the current source models, which model drivers in a logic stage, to simulate timing and noise characteristics of the logic stage. In addition, embodiment of the method may computationally find an alignment condition, between an aggressor stage and a victim stage, causing delays in the victim stage by noises coupled to the victim stage. For example, embodiment of the method may find an alignment condition when a relatively large trans-conductance gain of a victim stage, for example, a maximum gain within a pre-defined input and output voltage range, is reached. According to one embodiment, a trans-conductance gain of a victim stage may be associated with delays in the victim cell.

Embodiment of the invention may provide a method for performing analysis of at least one logic stage in a netlist, which may have at least one driver.

One embodiment of the method may include generating at least one look-up table, to be based on values of input and output voltages, for an output transient current using data available from a cell library; synthesizing analytically at least one current source model that may include a DC component and one or more parasitic capacitances using the look-up table; simulating the logic stage using the current source model to model the driver; and obtaining characteristics of the logic stage as simulated. According to one embodiment of a method, the cell library may be an industry standard cell library. According to another embodiment of a method, the cell library may include data conforming to an effective current source model (ECSM) and/or a composite current source model (CCSM).

According to one embodiment of a method, synthesizing the current source model may include representing the DC component of the current source model using a hyperbolic tangent function and curve-fitting the hyperbolic tangent function to values of the output transient current available from the look-up table. Furthermore, curve-fitting to values of the output transient current may include determining parameters that defines the hyperbolic tangent function using non-linear regression.

According to another embodiment of a method, synthesizing said current source model may further include determining values of the one or more parasitic capacitances by curve-fitting the current source model to values of the output transient current which are available from the look-up table.

According to one embodiment of a method, obtaining characteristics may include determining analytically a trans-conductance gain of the logic stage and identifying at least one condition of input and output voltages for reaching a pre-defined gain. For example, the pre-defined gain may be a maximum gain of the logic stage for a given input and output voltage range. Furthermore, the characteristics may include timing and noise characteristics of the logic stage.

According to another embodiment of a method, generating the look-up table for the output transient current may include representing analytically the input and output voltages and output transient current, respectively, as functions of time; sampling the input and output voltages and output transient current at a pre-determined time interval; sorting sampled output transient current values based on sampled input and output voltage values; and re-sampling the output transient current at input and output voltage values of pre-defined intervals.

According to one embodiment of a method, representing the output transient current as a function of time may include curve-fitting data of the output voltage, which may be available from the cell library, to a closed-form analytical equation; calculating a derivative of the closed-form analytical equation; and scaling the derivative to represent the output transient current. In addition, according to one embodiment, curve-fitting the output voltage may include curve-fitting the output voltage to a Weibull cumulative distribution equation.

Alternatively, according to another embodiment, representing the output voltage as a function of time may include curve-fitting data of the output transient current, which may be available from the cell library, to a closed-form analytical equation; calculating an integration of the closed-form analytical equation; and scaling the integration to represent the output voltage.

According to one embodiment of a method, curve-fitting the output transient current may include curve-fitting the output transient current to a quadratic equation.

Embodiment of the invention may provide methods for analyzing delays at an output of a victim stage due to an input transient voltage.

According to one embodiment, a method may include simulating the victim stage with at least one synthesized current source model using data available from at least one cell library; associating a trans-conductance gain of the victim stage with the delay at the output; and determining input and output voltages causing a pre-defined value of the trans-conductance gain through analyzing the simulated victim stage.

Embodiment of the invention may provide a system for executing embodiments of methods as described above. Embodiment of the invention may also provide a machine-readable medium which, if executed by a machine or data processing unit, may implement the methods as described above.

Results from simulations based on some embodiments of the invention are provided which demonstrate relatively good match to results available from SPICE based simulations, the latter of which is generally considered as benchmark simulation.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

Some portions of the detailed description in the following are presented in terms of algorithms and symbolic representations of operations on electrical and/or electronic signals. These algorithmic descriptions are representations may be the techniques used by those skilled in the electrical and electronic engineering and VLSI chip design to convey the substance of their work to others skilled in the art.

An algorithm is here, and generally, considered to be a self-consistent sequence of acts, actions, or operations leading to an expected or desired result. These include but are not limited to physical manipulation of physical quantities. Usually, though not necessarily, these quantities take the form of electrical or electronic signals capable of being stored, transferred, combined, compared, converted, and otherwise manipulated. It has proven convenient at times, principally for reasons of common usage, to refer to these signals as bits, values, elements, symbols, characters, terms numbers or the like. It shall be understood however that all of these and similar terms are to be associated with the appropriate physical quantities and are merely convenient labels applied to these quantities.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIG. 1 is a simplified diagram illustration of a current source model as is known in the art. Current source model 100 may be represented, for example, by a DC current source model 101, a first capacitance 102 ($C_m$) which may include for example a Miller capacitance between input and output, a second capacitance 103 ($C_o$) which may include for example parasitic capacitances between an output point 105 and a ground point 106, and an output load 104. Current source model 100 may produce an output voltage response 112 ($V_o$) based on an input voltage stimulus 111 ($V_i$) received.

Figure 2:
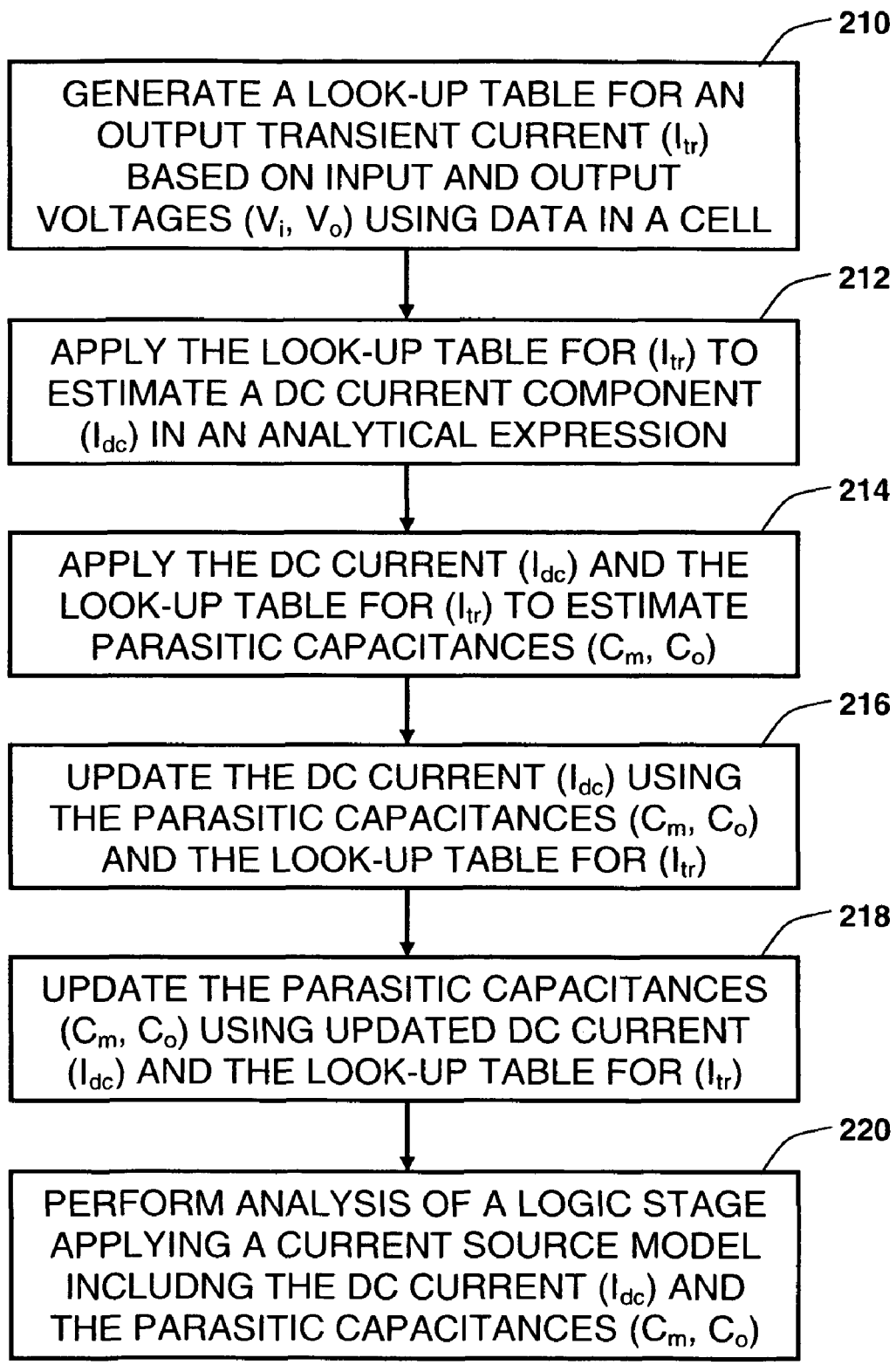
FIG. 2 is a simplified flowchart illustration of a method of synthesizing a current source model according to one embodiment of the invention.

FIG. 2 is a simplified flowchart illustration of a method of synthesizing a current source model according to one embodiment of the invention. Current source model 100 in FIG. 1, in particular, DC current source model 101 may be synthesized using characterization data available from a cell library, which may be an industry standard cell library, according to one embodiment of the present invention. In other words, DC current source model 101 may be synthesized using data conforming to, for example, CCSM and/or ECSM data format of industry standard. However, the present invention is not limited in this respect and data conforming to other data formats may be used.

At operation 210, one embodiment of the method may generate a look-up table for an output transient current. The look-up table may be two-dimensional, based on values of input and output voltages, from which the output transient current may be determined. The generation or creation of the look-up table may be through sampling piecewise output currents available from CCSM data of a cell library, and/or sampling piecewise output voltages available from ECSM data of a cell library.

At operation 212, a DC component of the output transient current may be determined or estimated. According to one embodiment of the method, the DC component may be represented using a closed-form analytical expression but the invention is not limited in this respect and other forms of expression, for example, numerical expression may be used. The closed-form analytical expression may include a shifted and scaled hyperbolic tangent function. Parameters defining the hyperbolic tangent function, such as a shifting parameter and a scaling parameter, may be determined or decided through, for example, curve-fitting based on nonlinear regression to a subset of data from the look-up table for the output transient current. In addition, a person skilled in the art may appreciate that the invention is not limited in this respect and other forms of analytical expressions or functions or equations may be used.

At operation 214, the DC current estimated at operation 212 and another subset of data from the look-up table for the output transient current may be used to estimate or determine capacitances such as, for example, Miller capacitance 102 ($C_m$) and output capacitance 103 ($C_o$) of the current source model 100 shown in FIG. 1. Therefore, the output transient current may be analytically expressed using the DC component and the capacitances ($C_m$, $C_o$) by applying a Kirchoff's Current Law (KCL) at node or output point 105. In general, for example, the KCL requires that at any one particular node (node 105), the sum of total input current shall equal to the sum of total output current.

At operation 216, the DC current may be updated using the estimated parasitic capacitances and the look-up table for output transient current. The update may be through curve-fitting the DC current to values of the output transient current as described below in detail with reference to FIG. 5. Similarly, at operation 218, the parasitic capacitances, for example, $C_m$ and $C_o$, may be updated by using the updated DC current and the look-up table for output transient current as well. According one embodiment, after update at operations 216 and 218, estimated DC current and parasitic capacitances may be sufficiently accurate. However the invention is not limited in this respect and operations 216 and 218 may be repeated until the DC current and parasitic capacitances converge within an acceptable narrow range.

At operation 220, the DC current and parasitic capacitances obtained at operations 216 and 218 may be applied to analyze an output response of the current source model under the condition of a given input voltage waveform. The synthesized current source model 100 (FIG. 1) may be used to simulate performance of drivers and/or logic stages in a netlist of a VLSI chip. The performance may include, for example, timing and noise characteristics but other characteristics may also possibly be simulated.

Figure 3A:
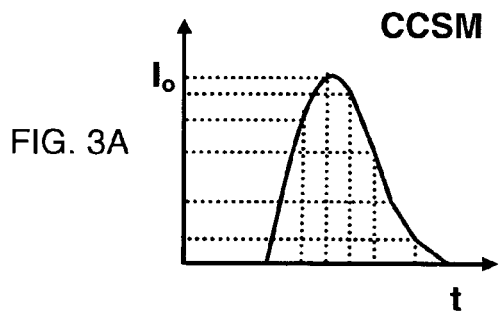
FIGS. 3A-3H are diagram illustrations of a method of generating a look-up table for an output transient current based on transient input and output voltages according to one embodiment of the invention.
Figure 3D:
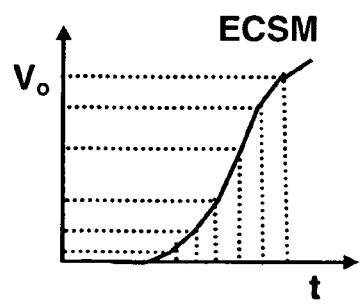
Figure 3B:
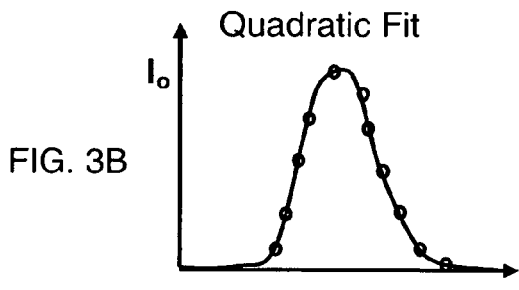
Figure 3E:
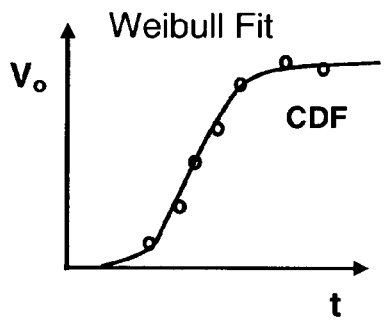

FIGS. 3A-3H are diagram illustration of a method of generating a look-up table for output transient current based on input and output voltages according to one embodiment of the invention. FIG. 4 is a flowchart illustration of a method of generating a look-up table for output transient current based on input and output voltages according to another embodiment of the invention. The look-up table may be generated or created using data available from a cell library that contains data entry format such as, for example, CCSM and/or ECSM data format. Data in other formats may be used.

At operation 410, one embodiment of the method may decide the data format, CCSM or ECSM for example, in the cell library to be used in creating or generating a look-up table.

At operation 411, if CCSM is used, data of output transient current may be available for different transition time or slew conditions of input and capacitances of output. FIG. 3A is a diagram illustration of one of the output transient current waveforms shown in a piecewise format. According to one embodiment of the method, the piecewise output current waveform may be curve-fitted by applying linear and/or non-linear regression, at operation 412 and shown in FIG. 3B, to an analytical expression $I_{tr}(t)$. The analytical expression may be, for example, a quadratic expression. In addition, a person skilled in the art may appreciate that the invention is not limited in this respect and other analytical expressions or equations or functions may be used.

Figure 3C:
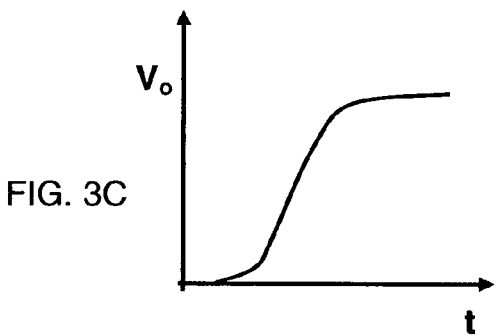
Figure 4:
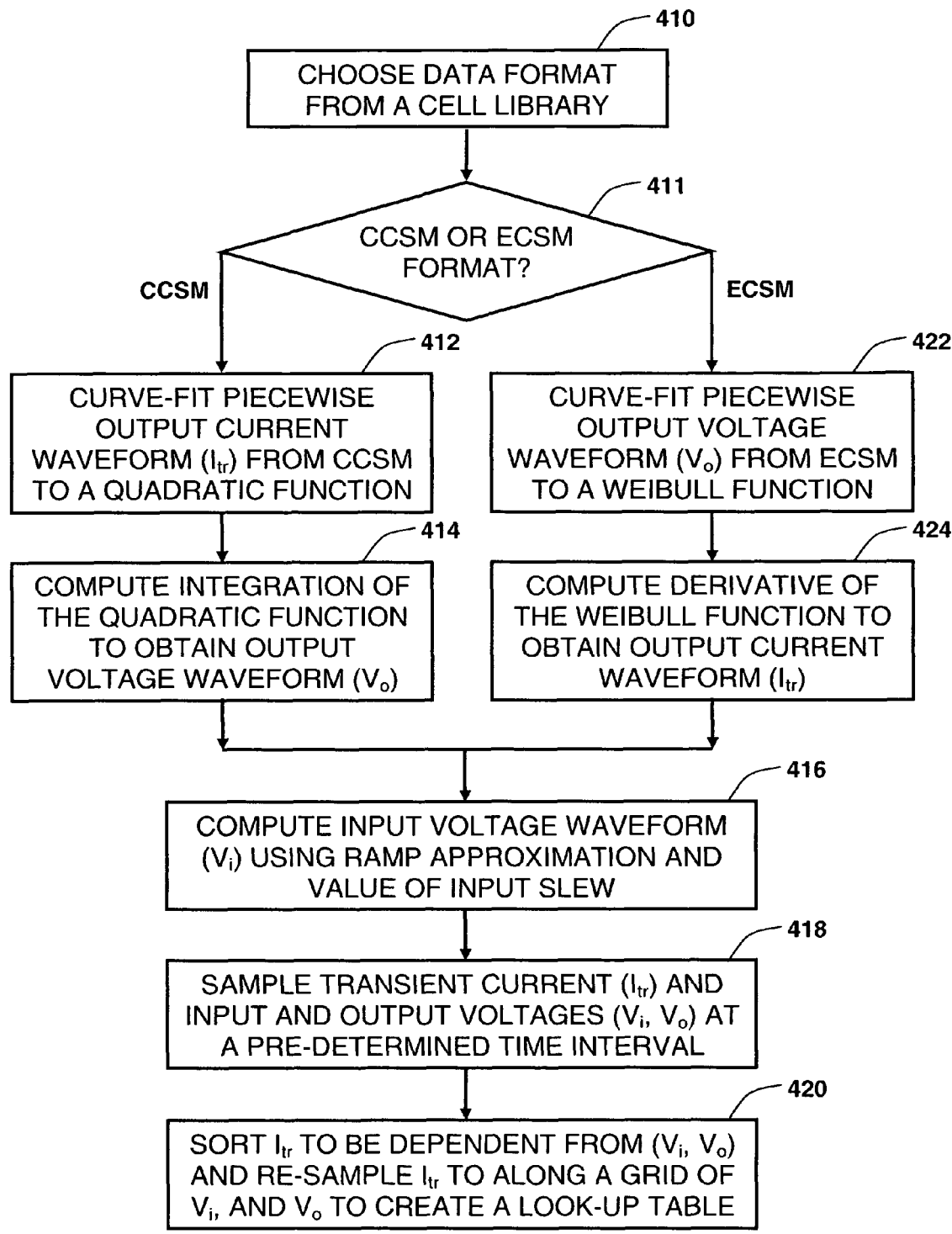
FIG. 4 is a flowchart illustration of a method of generating a look-up table for an output transient current based on transient input and output voltages according to one embodiment of the invention.

At operation 414 and as shown in FIG. 3C, the analytical expression for output transient current may be integrated and then scaled with output capacitances to create an analytical expression for an output voltage $V_o(t)$.

$$V_o(t) = \frac{1}{C_o} \int I_{tr}(t) dt$$

At operation 411, if ECSM is used, data of output transient voltage may be available for different transition time or slew conditions of input and capacitances of output. FIG. 3D is a diagram illustration of one of the output voltage waveforms shown in a piecewise format. According to one embodiment of the method, the piecewise output voltage may be curve-fitted to an analytical expression $V_o(t)$, for example, a Weibull cumulative distribution function (CDF), at operation 422 and as shown in FIG. 3E, through linear and/or nonlinear regression. A person skilled in the art may appreciate that the invention is not limited in this respect and the output voltage waveforms $V_o(t)$ may be modeled by other analytical expressions and/or functions.

Figure 3F:
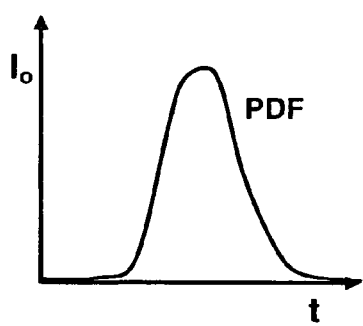

The output voltage waveform $V_o(t)$ obtained at operation 422 may be in a differentiable form. At operation 424 and as shown in FIG. 3F, derivative of the output voltage waveform $V_o(t)$ may be computed, which may then be scaled with the output capacitance $C_o$ to represent an output transient current $I_{tr}(t)$. For example, the derivation and scaling may be expressed as $$I_{tr}(t) = C_o \frac{dV_o(t)}{dt}$$

Figure 3G:
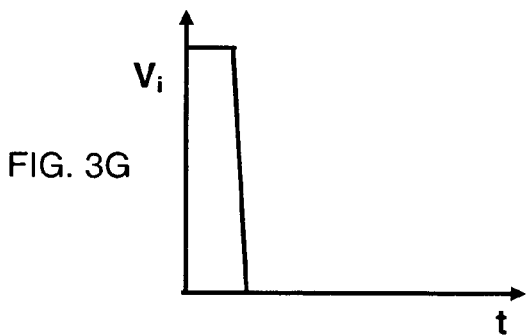

At operation 416 and as shown in FIG. 3G, an input voltage waveform may be analytically modeled as well. The input voltage waveform $V_i(t)$ may be modeled using, for example, a saturated ramp approximation and the value of an input slew.

Based on above operations 412-416, input voltage $V_i(t)$, output voltage $V_o(t)$, and output transient current $I_{tr}(t)$ may have been represented as functions of time respectively. At operation 418, input voltage $V_i(t)$, output voltage $V_o(t)$, and output transient current $I_{tr}(t)$ may be sampled at a pre-determined or pre-defined time interval to create a set of sampled data.

Figure 3H:
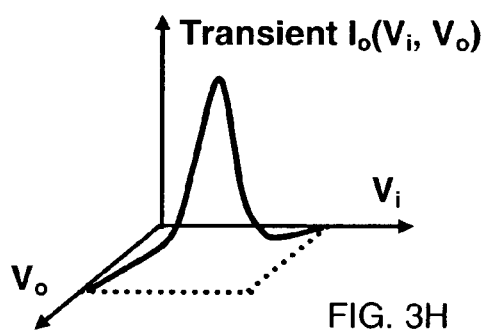

At operation 420 and as shown in FIG. 3H, the data for output transient current may be sorted to be dependent from input and output voltages. One embodiment of the method may include further dividing the range of input and output voltages ($V_i$, $V_o$) into a pre-defined or pre-determined grid and re-sample the output transient current at most of the grid points. The sampling may be through interpolation but other methods of data sampling may be used.

According to one embodiment of the invention, one or more entries for output transient current at different input slews and output capacitances, from CCSM and/or ECSM of the cell library, may be sampled and formulated to create their respective look-up tables. In one embodiment, all of the entries in CCSM and/or ECSM may be processed, based on operations in FIG. 4 and illustrated in FIG. 3A-3H, to create or generate look-up tables from which an output transient current may be decided based on values of input and output voltages.

Figure 5:
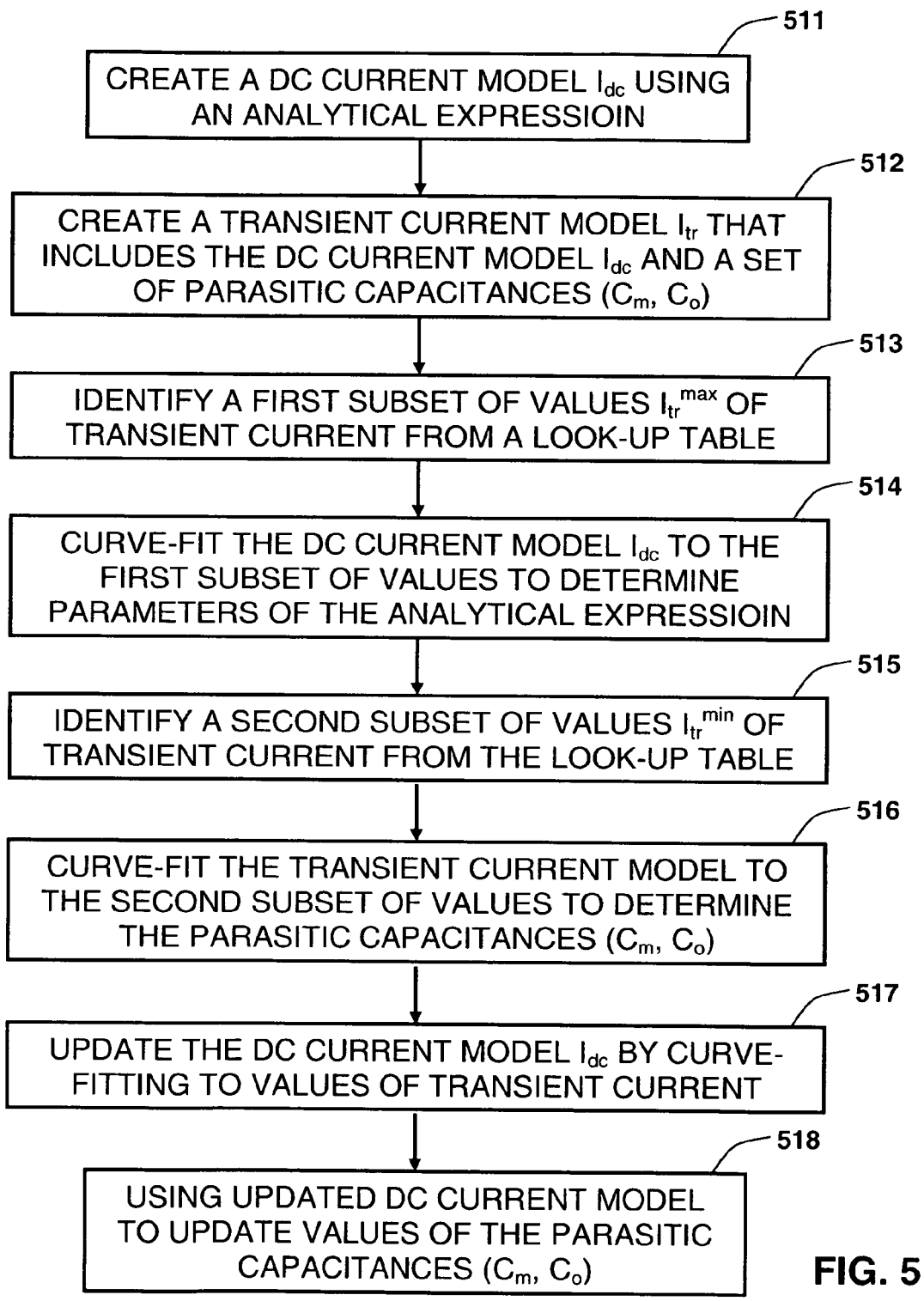
FIG. 5 is a flowchart illustration of a method of synthesizing a current source model represented by a DC current source model and parasitic capacitors using data from a look-up table for an output transient current according to one embodiment of the invention.

FIG. 5 is a flowchart illustration of a method of synthesizing a current source model from a look-up table for output transient current according to one embodiment of the invention. At operation 511, one embodiment of the method may apply an analytical expression to create a DC current source model that may be part of a transient current source model. For example, a shifted and scaled hyperbolic tangent function may be used to represent the DC component or DC current source model. The function may be expressed as below.

$$I_{dc}(V_i, V_o) = k_0 + k_1 \tan h((V_i - k_2) k_3)$$

Wherein, shifting parameters $k_0$ and $k_2$ may vary linearly with respect to output voltage $V_o$ and scaling parameters $k_1$ and $k_3$ may be expressed as quadratic functions of output voltage $V_o$. It will be appreciated by a person skilled in the art that the present invention is not limited in this respect and other analytical expressions may be used for the DC current source model.

At operation 512, one embodiment of the method may define or create a transient current source model based on the DC component as described above and a plurality of parasitic capacitances, for example, a Miller capacitance $C_m$ and an output capacitance $C_o$ by applying the KCL at the output node 105. The transient current source model may have an analytical expression as below:

$$I_{tr}(V_i,V_o)=I_{dc}(V_i,V_o)-C_m(\dot{V}_o-\dot{V}_i)-(C_o+C_l)\dot{V}_o$$

In the above expression, the "dot" on top of a variable $V_i$ and/or $V_o$ denotes a derivative of the variable. As a person skilled in the art may appreciate from the above expression that, values of output transient current $I_{tr}(V_i,V_o)$ under slower input and output transition conditions may relatively accurately represent the DC component of the output transient current $I_{tr}(V_i,V_o)$. In other words, values of $I_{tr}(V_i,V_o)$ corresponding to higher output load and input slew may be close representatives of the DC component. Based on the above observation, the DC current component of above transient current source model may be decided based on a subset of relatively large values of look-up tables for output transient current. For example, according to one embodiment, the DC current component may be determined based on a set of maximum values of look-up tables for output transient current under different input slew and output capacitance conditions.

Accordingly, at operation 513, a first subset of output transient current values may be identified. The first subset of values may be those relative large, and in one embodiment the largest, values of the output transient current selected from one or more look-up tables corresponding to a group of, and in one embodiment all of, the conditions for input slews and output capacitances. The first subset of output transient current values may be collectively represented herein as $I_{tr}^{max}(V_i,V_o)$.

At operation 514, the DC current source model, for example, a shifted and scaled hyperbolic tangent function, may be curve-fitted to the first subset of output transient current values from the look-up tables as described above. The curve-fitting may be through a linear and/or nonlinear regression and may determine parameters in the hyperbolic tangent function that define the DC current source model.

On the other hand, Miller capacitance $C_m$ and output capacitance $C_o$ may significantly reduce the output transient current due to their parasitic impedance, and their impact may be estimated from values selected from the look-up table corresponding to fast input and output transition conditions. Accordingly, at operation 515, a second subset of values may be identified which may include relatively small, and in one embodiment the smallest, output transient current values selected from one or more look-up tables over at least some of, and in one embodiment all of, the input slew and output capacitance conditions. For example, the second subset of values may be selected from the look-up table corresponding to the two least output capacitances and input transition times. The second subset of output transient current values may be collectively represented herein as $I_{tr}^{min}(V_i,V_o)$ At operation 516, parasitic capacitances $C_m$ and $C_o$ may be determined by curve-fitting the transient current source model, as described above, to the second subset of values of output transient current that may be, for example, the smallest output transient current values selected from one or more look-up tables over all the input transition time and output capacitance conditions.

At operation 517, the DC current source model may be updated with the above estimated values of capacitances $C_m$ and $C_o$ at operation 516. The update may be through curve-fitting, using nonlinear regression for example, the transient current source model to the first subset of transient current values available from the look-up table.

At operation 518, the updated DC current source model may in turn be used to further refine the capacitance values obtained at operation 516.

In a netlist, a logic stage, which may be an aggressor stage, may capacitively couple noises to a neighboring logic stage, which may be a victim stage, during switching. The coupling of noise may cause delays in the output of the victim stage if the victim stage switches simultaneously with the aggressor stage. A condition between transitions of the aggressor stage and the victim stage that causes changes in delays of the victim stage may be known as an alignment. For example, a worst case alignment may refer to a condition when a maximum delay in the victim stage is caused. Other conditions may cause less delay than the worst case.

According to embodiments of the invention, one embodiment of a method may provide an analytical solution for identifying alignments causing changes in delays. As a person skilled in the art may appreciate that, a CMOS channel connected component may be considered as an operating transitional amplifier (OTA). The gain of an OTA, which is a trans-conductance $G_m$, may be expressed as a function of its operating point defined by its input and output voltages ($V_i$, $V_o$). A noise coupled to the CMOS channel connected component, which may be a receiver stage or victim stage in this context, from one of its neighboring stages or aggressor stages may be considered as a small-signal input and therefore the impact of input noise may be magnified by the amplification gain $G_m(V_i, V_o)$ of the receiver stage, causing changes in delay at the receiver output.

Figure 6:
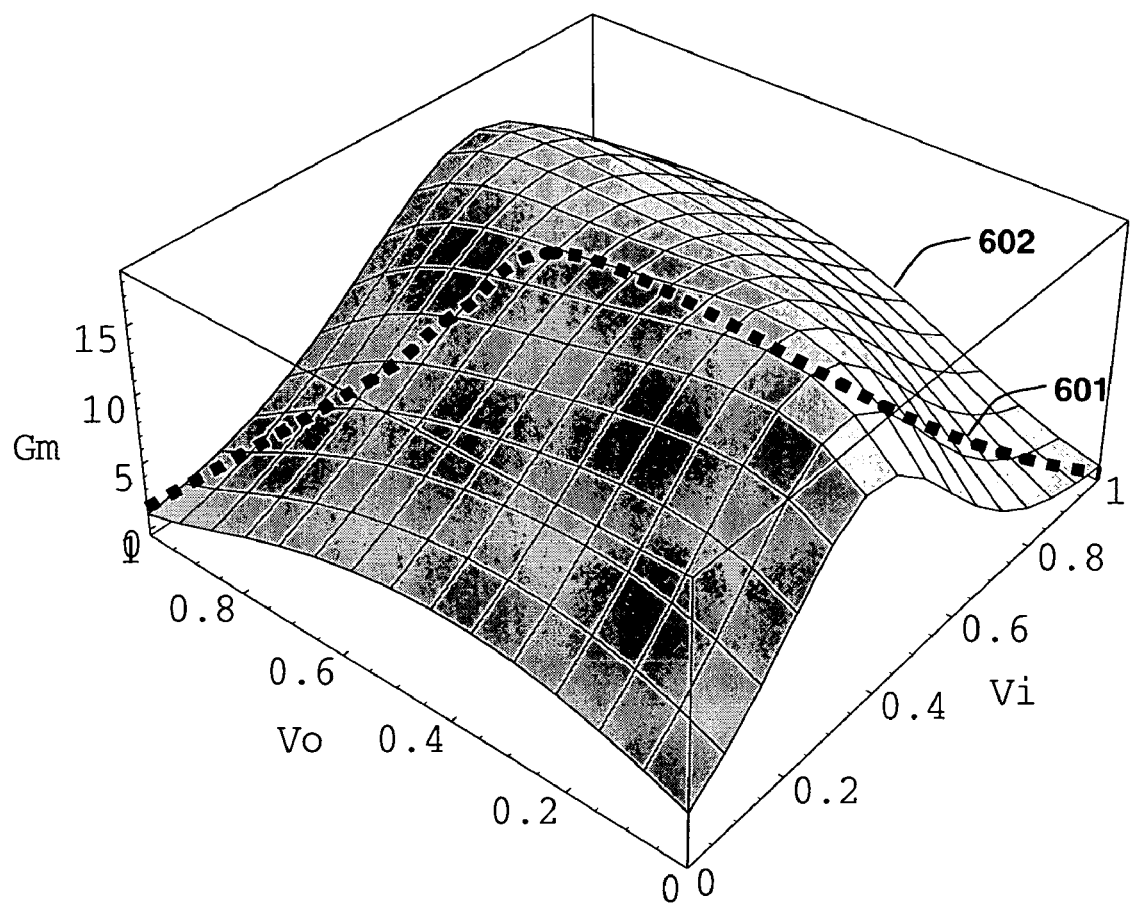
FIG. 6 is a graphical illustration of a trans-conductance gain of a logic stage as a function of input and output voltages according to one embodiment of the invention.

FIG. 6 is a graphical illustration of a trans-conductance gain of a receiver stage as a function of input and output voltages according to one embodiment of the invention. Input and output voltages of the receiver stage or victim stage may vary during the nominal transition, and therefore the operating point of the trans-conductance gain $G_m(V_i, V_o)$ may also vary over transition of the victim stage. In FIG. 6, a trans-conductance gain $G_m(V_i, V_o)$ of a receiver stage is illustrated as a two-dimensional curved surface 602 and a trajectory of $G_m(V_i, V_o)$ for a noiseless input rising and output falling transition is illustrated by a dotted line 601. In FIG. 6, input and output voltages are normalized with respect to a supply voltage. A person skilled in the art may appreciate from FIG. 6 that for a typical noiseless transition the $G_m(V_i, V_o)$ curve of the output receiver is unimodal. Therefore, a worst case alignment between transitions of the aggressor and victim stages may occur when the victim transition align with the maximum point of the trajectory of gain $G_m(V_i, V_o)$.

Figure 7:
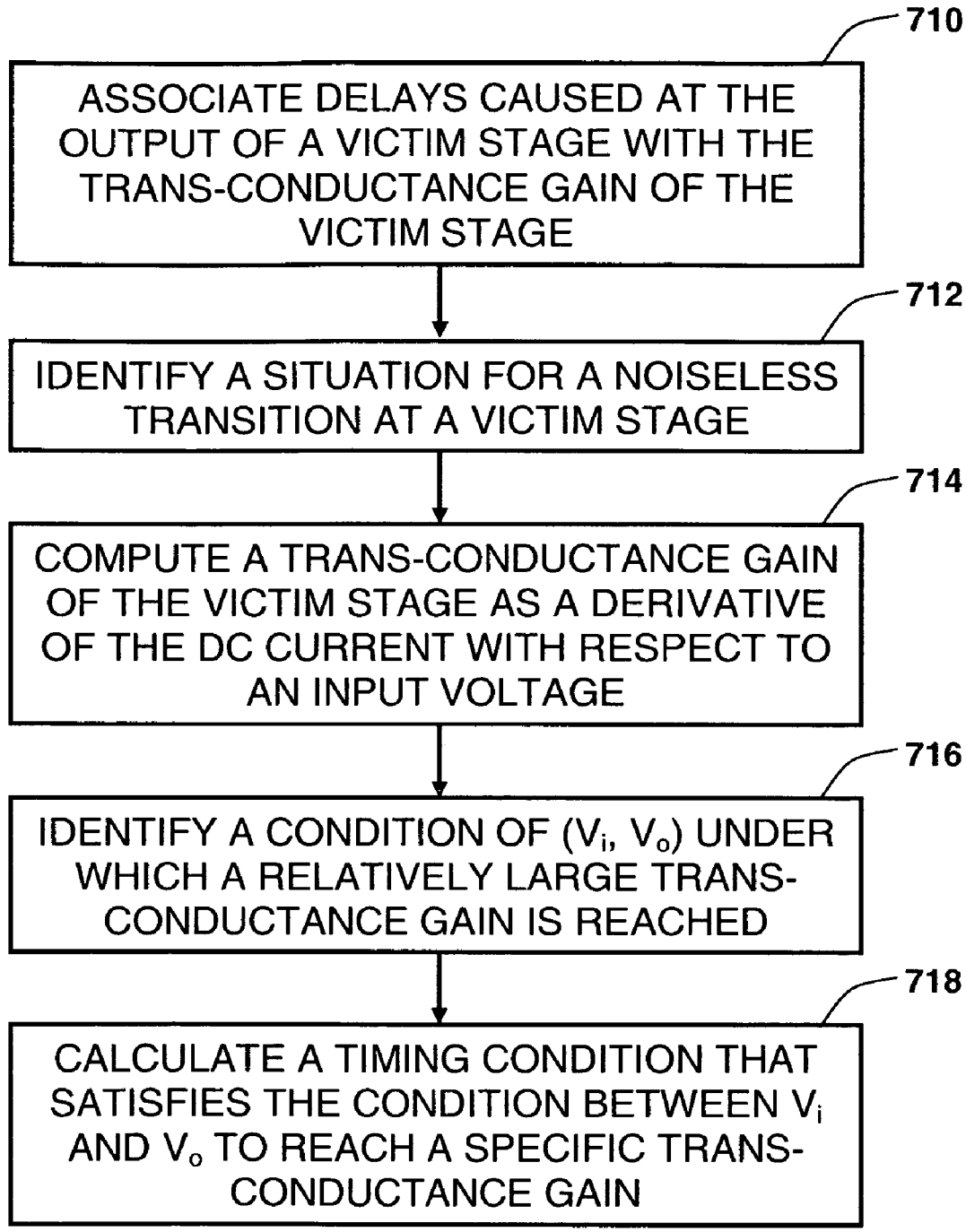
FIG. 7 is a flowchart illustration of a method of identifying conditions causing delay noise at the output of a victim stage according to one embodiment of the invention.

FIG. 7 is a flowchart illustration of a method of identifying conditions causing delays at the output of a victim stage according to one embodiment of the invention. At operation 710, one embodiment of the method may associate delays caused at the output of a victim stage with the trans-conductance gain of the victim stage. As is described above, a noise coupled to a receiver stage or victim stage from one of its neighboring stages or aggressor stages may perform like a small-signal input and as a result the impact caused by the noise may be amplified by the trans-conductance gain $G_m(V_i, V_o)$ of the receiver stage, which in turn cause changes in delay at the receiver output.

At operation 712, a noiseless transition or operation of a victim stage may be identified. At operation 714, a trans-conductance gain of the victim stage for the noiseless transition or operation may be analytically obtained, according to one embodiment of a method, through calculating or computing a partial derivative of the DC current source model, with respect to an input voltage. The analytical expression for the trans-conductance gain may be shown as follows:

$$G_m(V_i, V_o) = \frac{\partial I_{dc}(V_i, V_o)}{\partial V_i} = k_1 k_3 \text{sech}^2((V_i - k_2)k_3)$$

As is described above in FIG. 5, scaling parameters $k_1$ and $k_3$ are polynomial function of $V_o$ whereas $\text{sech}^2((V_i-k_2)k_3)$ is an exponential function of $V_i$ and $V_o$.

At operation 716, a condition for achieving a relatively large gain $G_m(V_i, V_o)$, within a range of interest for input and output voltages ($0 \leq V_i$, $V_o \leq V_{dd}$, with $V_{dd}$ being a supply voltage), may be computed analytically. For example, a condition for reaching a maximum gain $G_m(V_i, V_o)$ may be dominated by the term $\text{sech}^2((V_i-k_2)k_3)$, which may occur when the variable x of function $\text{sech}^2(x)$ equals zero. In other words, a maximum trans-conductance gain may occur when the following equation is satisfied.

$$(V_i-k_2)k_3=0.$$

According to one embodiment of the invention, $k_2$ is a linear function of $V_o$ and $k_3$ is larger than zero, the solution to the maximum of receiver cell $G_m(V_i, V_o)$ reduces to a simple linear expression in $V_i$ and $V_o$.

$$V_i = mV_o + c.$$

Since the input and output voltages are functions of time, at operation 718, a timing condition that satisfies the above relationship between an input voltage and an output voltage may be calculated or obtained. Accordingly, embodiment of the invention provides a method to identify a relationship, and in one embodiment a worst-case relationship, between delays in the output of a victim logic stage and the timing of input noise from an aggressor logic stage.

Figure 12A:
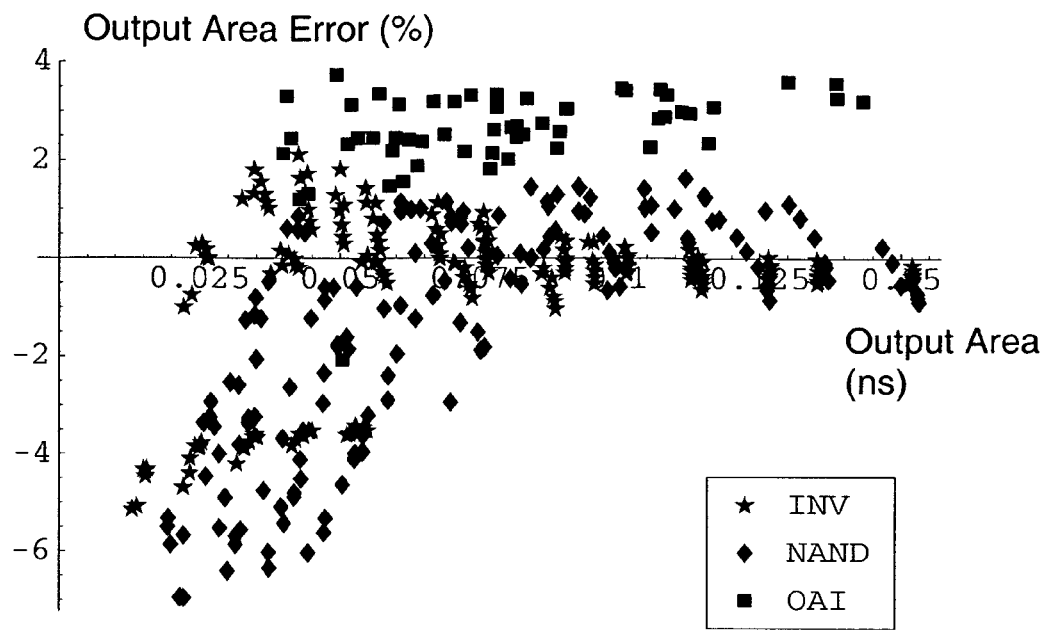
FIGS. 12A and 12B are sample simulation results of relative output area errors and relative output peak errors respectively in accordance with some embodiments of the invention.
Figure 12B:
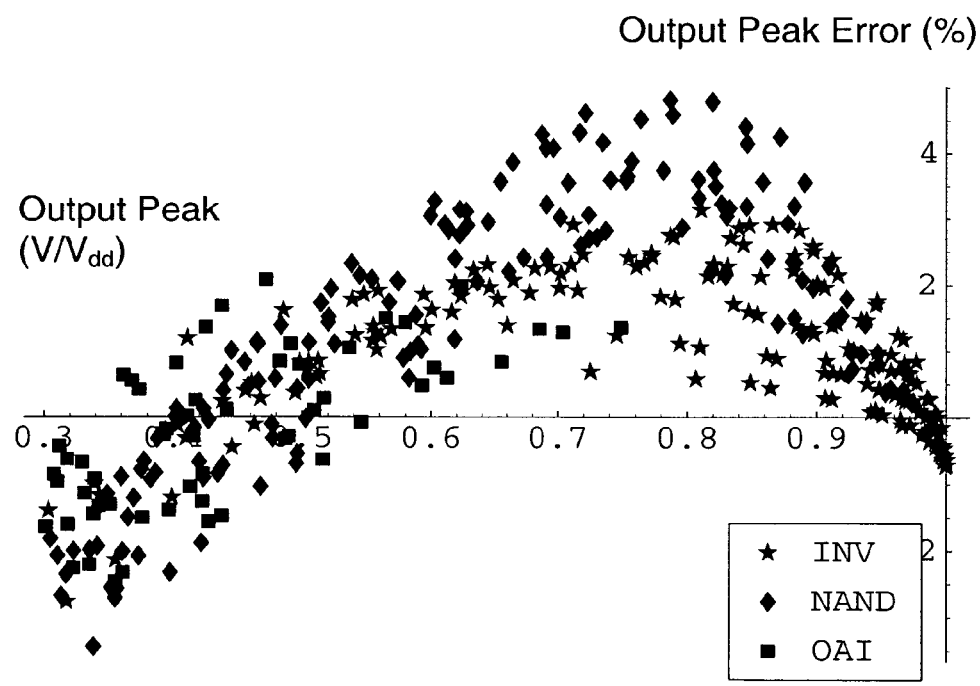
Figure 13:
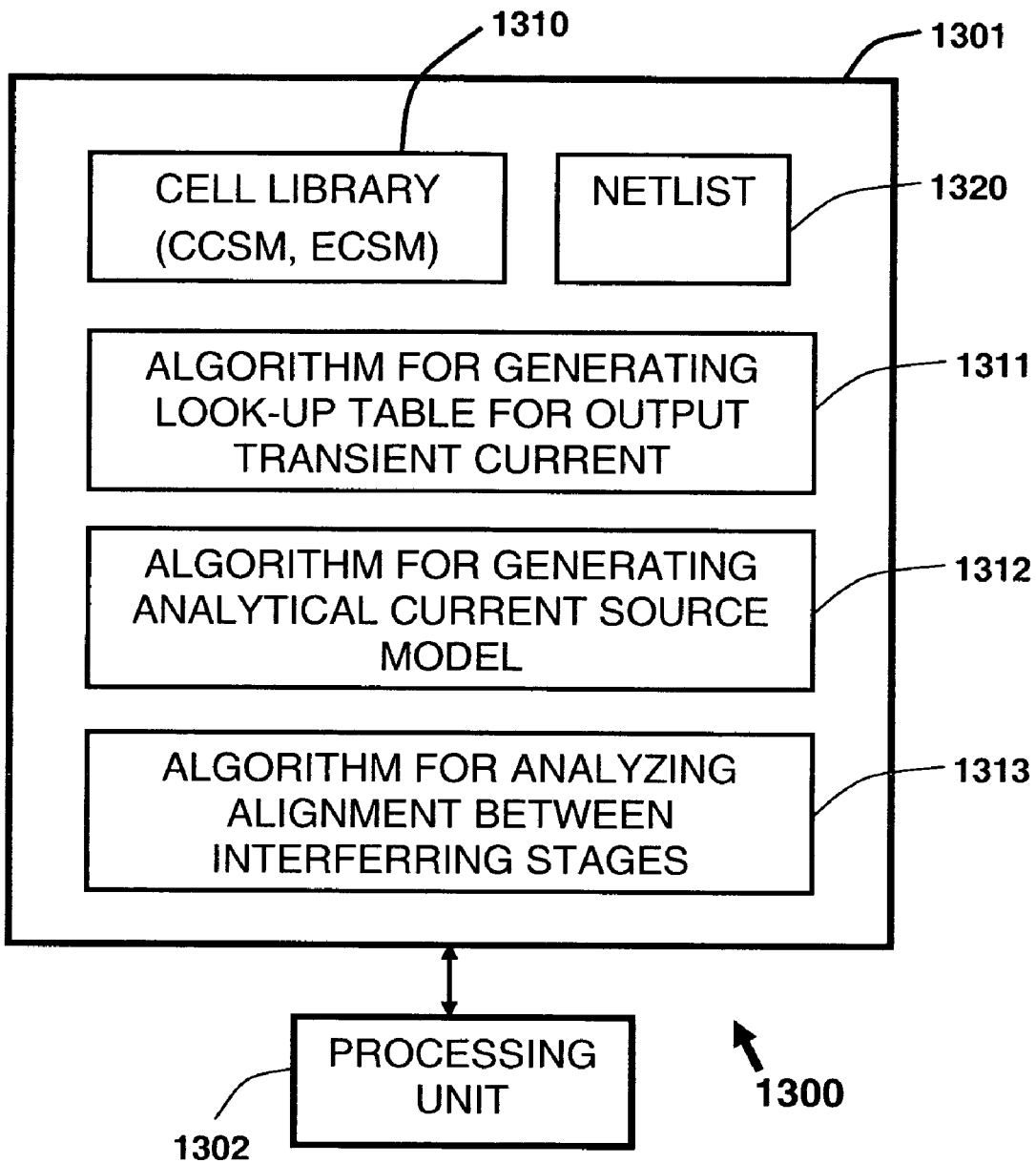
FIG. 13 is a diagram illustration of a system adapted to synthesize a current source model according to one embodiment of the invention.

The efficacy of some embodiments of the present invention are presented in FIGS. 8-12 in the following, using simulation results from three drivers and seven nets extracted from a 65 nm industrial design. The three drivers include OAIX10, NAND4X20 and INVX30 which represent cells or stages with different drive strengths and different internal stack structure. For brevity, only results from worst case timing arc (i.e. the arc farthest from the output node) are presented for multi input gates OAIX10 and NAND4X20. It shall be appreciated that since the internal node capacitances may not be accurately modeled in the cell level CSM driver model, the worst case timing arcs are also the most difficult test cases. The seven (7) nets include five (5) RC nets, with different ratios of coupling capacitance to ground capacitance, and two (2) RLC nets. A prototype for the proposed CSM synthesis algorithm was implemented in Mathametica as an example for validation purpose. A person skilled in the art will appreciate that the prototype may be implemented using other computational tools or in computer programs that may run on, for example, various computational platforms. A computational platform having implemented one embodiment of the present invention is shown in FIG. 13.

Current source models for the above described three drivers were generated using ECSM characterization data for each cell. Timing analysis is performed for five (5) input slews ranging between 50 ps to 150 ps. The aggressor drivers were held quiet during experiment. The maximum and average error in far end delay and output slew over all input slews are listed in the left half of Table 1 under the labeling of "Timing Analysis".

TABLE 1

| DRIVERS | NETS | Timing Analysis | | | | Glitch Propagation | | | |
| --- | --- | --- | --- | --- | --- | --- | --- | --- | --- |
| | | Delay | | Op Slew | | Area | | Peak | |
| | | Max | Avg | Max | Avg | Max | Avg | Max | Avg |
| INVX30 | rc1 | −1.49 | 1.13 | 2.35 | 1.30 | −2.39 | 1.51 | −3.80 | 1.15 |
| | rc2 | −1.47 | 0.98 | 2.40 | 1.15 | −4.32 | 1.11 | 2.43 | 1.09 |
| | rc3 | −2.40 | 1.51 | 3.10 | 1.92 | 4.20 | 2.32 | −3.54 | 1.45 |
| | rc4 | −1.27 | 0.77 | 2.82 | 1.43 | −4.10 | 1.07 | 2.41 | 1.12 |
| | rc5 | −1.62 | 1.16 | −2.83 | 1.68 | 2.71 | 1.95 | −3.85 | 1.24 |
| | Rlc1 | −1.09 | 0.67 | 4.37 | 1.85 | 2.91 | 1.63 | −3.79 | 1.39 |
| | Rlc2 | 1.23 | 0.60 | 5.09 | 2.42 | −5.14 | 1.35 | 2.86 | 1.35 |
| NAND4x20 | rc1 | 1.37 | 0.72 | 1.96 | 1.32 | −5.86 | 1.73 | 4.80 | 2.16 |
| | rc2 | 1.16 | 0.64 | 2.28 | 1.70 | −6.41 | 1.81 | 4.58 | 2.13 |
| | rc3 | 3.01 | 1.33 | 2.03 | 1.16 | −6.95 | 1.96 | 4.78 | 2.23 |
| | rc4 | 0.91 | 0.63 | 2.39 | 2.04 | −6.35 | 1.93 | 4.28 | 1.97 |
| | rc5 | 1.87 | 0.90 | 1.42 | 0.85 | −6.96 | 1.89 | 4.61 | 2.10 |
| | Rlc1 | 1.53 | 1.19 | 1.64 | 1.40 | −6.03 | 2.37 | 3.73 | 1.93 |
| | Rlc2 | 1.25 | 1.08 | 1.67 | 1.49 | −6.04 | 2.41 | 3.60 | 1.78 |
| OAIX10 | rc1 | 2.60 | 2.19 | 1.81 | 1.42 | 3.57 | 3.05 | −1.65 | 0.98 |
| | rc2 | 3.20 | 2.68 | 2.04 | 1.81 | 3.74 | 3.20 | −2.27 | 0.82 |
| | rc3 | 3.22 | 2.71 | 2.14 | 1.85 | 3.27 | 2.32 | 1.68 | 0.92 |
| | rc4 | 3.20 | 3.00 | 2.42 | 2.01 | 3.19 | 3.11 | −2.22 | 1.00 |
| | rc5 | 2.54 | 2.10 | 1.74 | 1.35 | 3.21 | 2.40 | 2.07 | 1.03 |
| | rlc1 | 2.88 | 2.78 | 2.01 | 1.90 | 2.57 | 2.32 | −2.48 | 1.20 |
| | rlc2 | 3.07 | 3.02 | 2.02 | 1.92 | 2.08 | 1.99 | −0.67 | 0.29 |
| ALL NETS | | 3.22 | 1.51 | 5.09 | 1.62 | −6.96 | 2.07 | 4.80 | 1.40 |

A person skilled in the art will appreciate that the proposed ECSM based current source driver models provide results of simulation with accuracies that are comparable to those that may be obtained from a SPICE simulation.

Figure 8A:
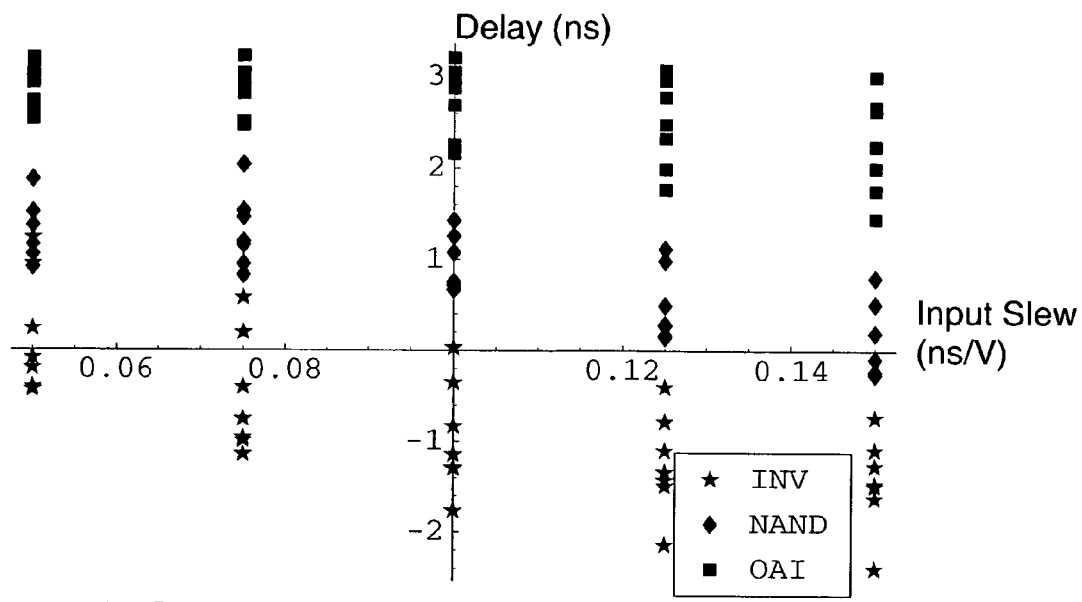
FIGS. 8A and 8B are sample simulation results of delays and output slews respectively at various input slews in accordance with some embodiments of the invention.
Figure 8B:
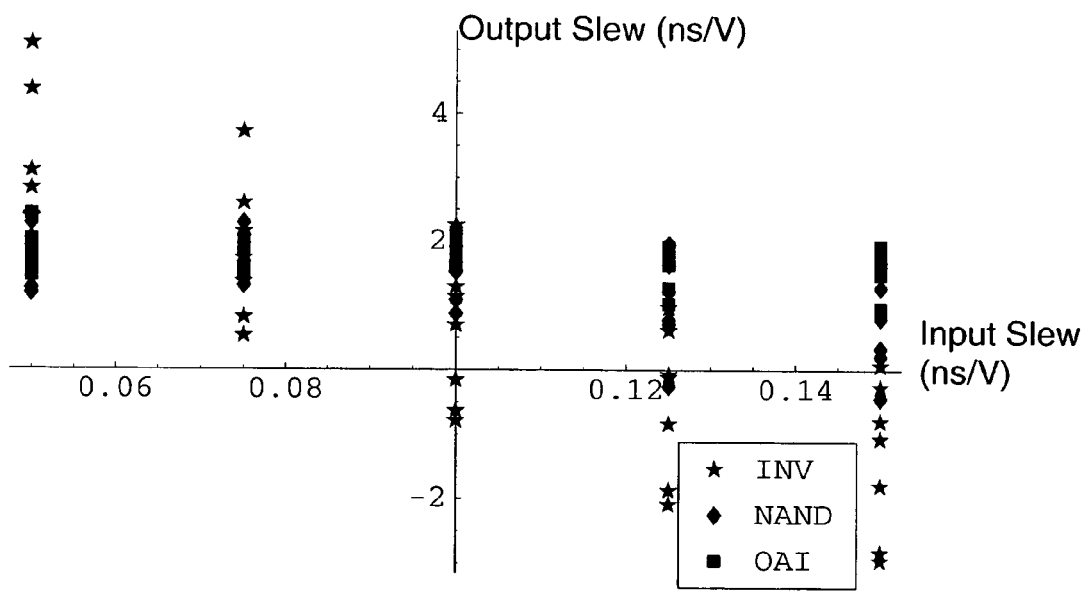

FIGS. 8A and 8B are sample simulation results of error plots of far end delay versus input slew and far end output slew versus input slew respectively in accordance with some embodiments of the invention. As indicated by the legends in FIGS. 8A and 8B, "star" symbols represent results for driver INVX30, "diamond" symbols represent results for driver NAND4X20, and "square" symbols represent results for driver OAIX10. As are shown in FIGS. 8A and 8B, delays and output slews of a larger driver INVX30 may be over estimated for smaller values of input slews whereas they may be under estimated for higher values of input slews because of a linear approximation for a relatively large nonlinear Miller capacitance.

Figure 9A:
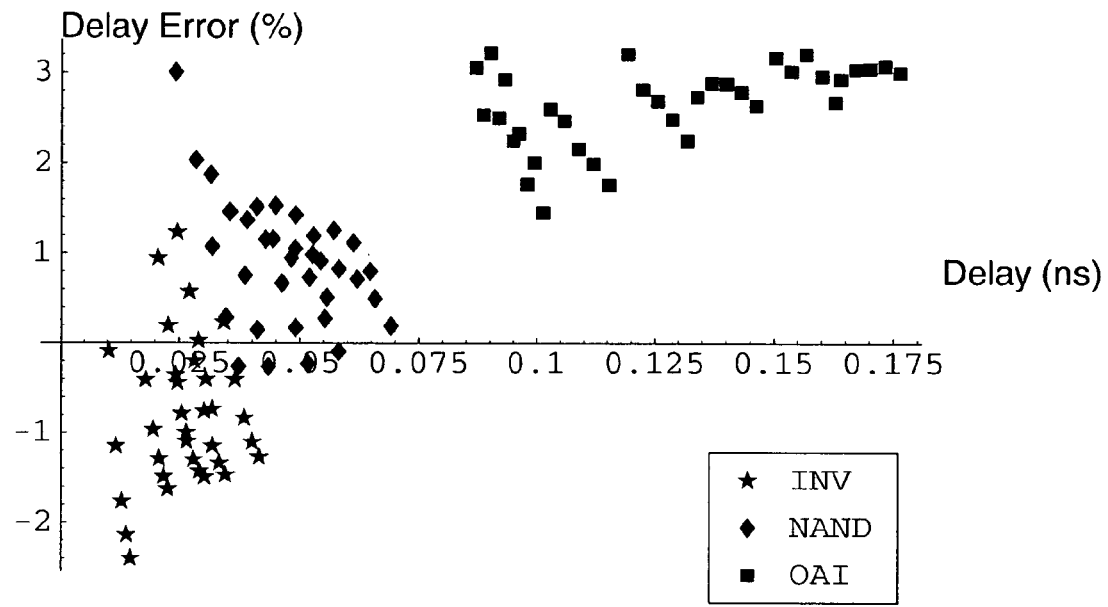
FIGS. 9A and 9B are sample simulation results of relative delay errors and relative output slew errors respectively in accordance with some embodiments of the invention.
Figure 9B:
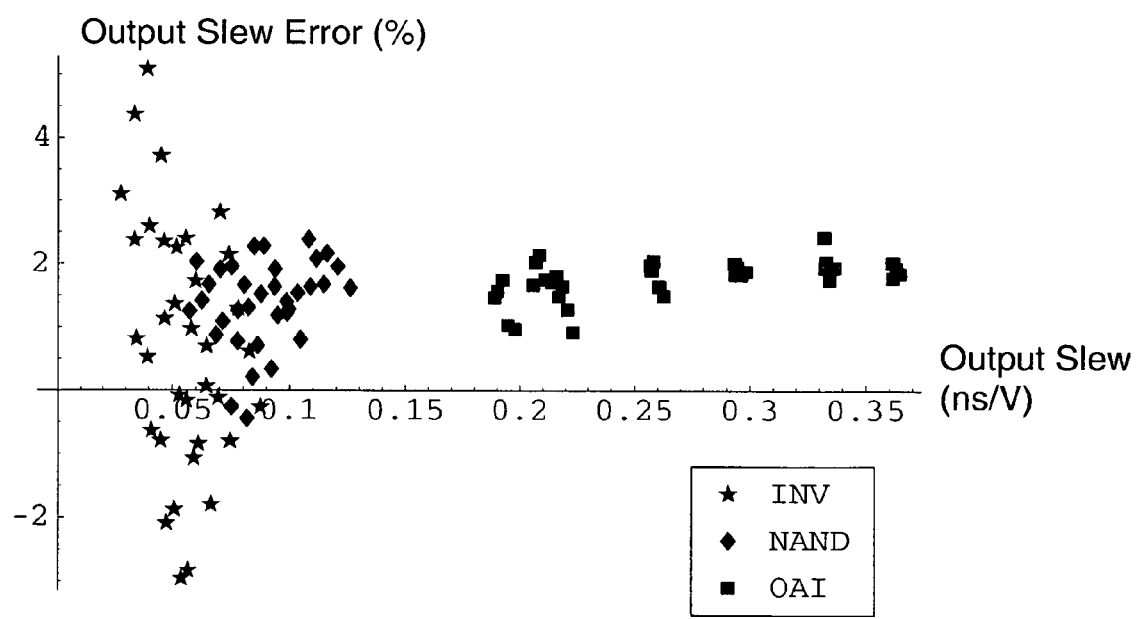

FIGS. 9A and 9B are sample simulation results of delay errors and output slew errors respectively for three different drivers in accordance with some embodiments of the invention. The errors are shown in terms of absolute errors versus relative errors. It shall be noted that relative errors are big only when the absolute errors are small and vice versa, which shall be appreciated by a person skilled in the art as an indication for the robustness of the embodiments of the present invention.

The efficacy of the proposed driver models for functional noise (glitch) propagation were further proved by testing noise glitches at the driver input for different input noise peaks (50%-100% $V_{dd}$) and widths. Similar to timing analysis, aggressor drivers were held quiet during testing. The output area and output peak of the propagated noise glitches at a far end were measured using driver model in accordance with some embodiments of the invention, and compared with results obtained from SPICE simulations. The maximum and average estimation error in output noise peak and width over all input noise peaks and widths is listed in the right half of Table 1 under the label of "Glitch Propagation". As is illustrated, glitch propagation based on driver models of some embodiments of the invention has much better accuracy than other previous approach, which reported maximum and average errors in output area of 20% and 8% and that in output peak of 11% and 5% respectively.

Figure 10A:
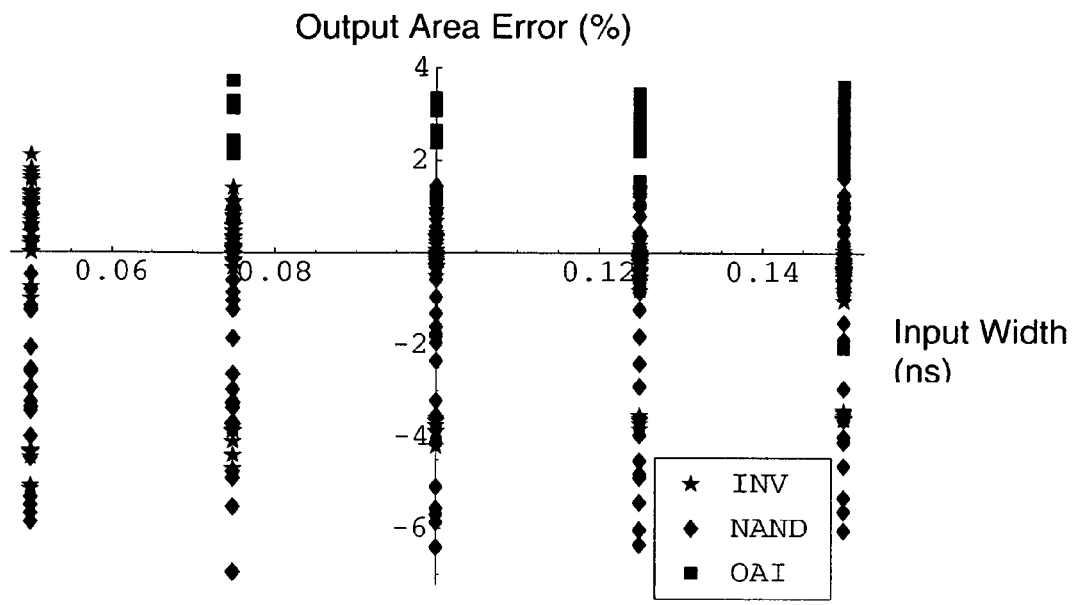
FIGS. 10A and 10B are sample simulation results of output area errors with respect to input width and input peak respectively in accordance with some embodiments of the invention.
Figure 10B:
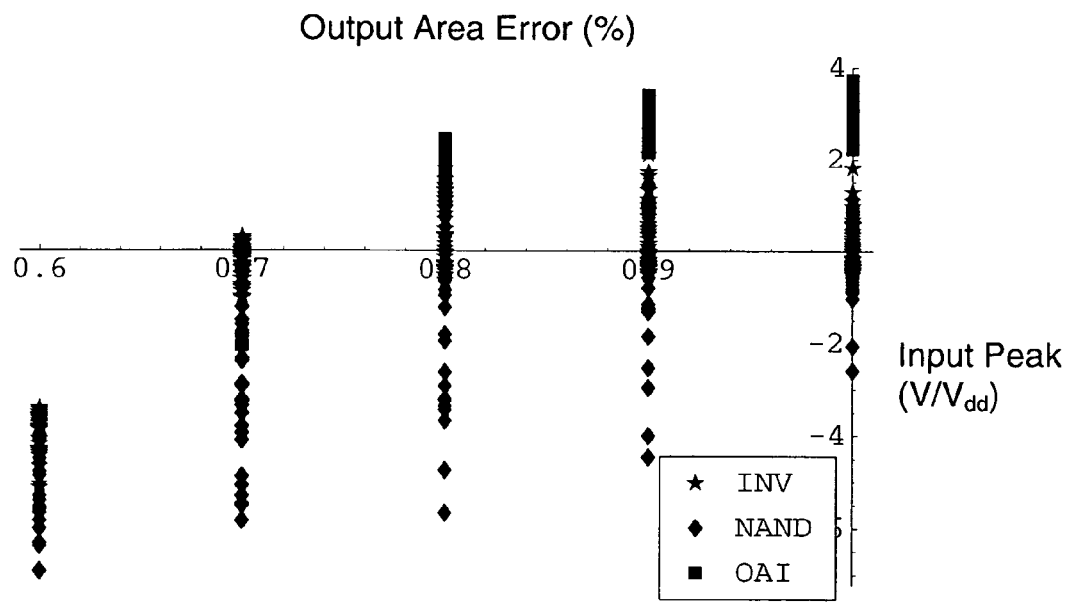
Figure 11A:
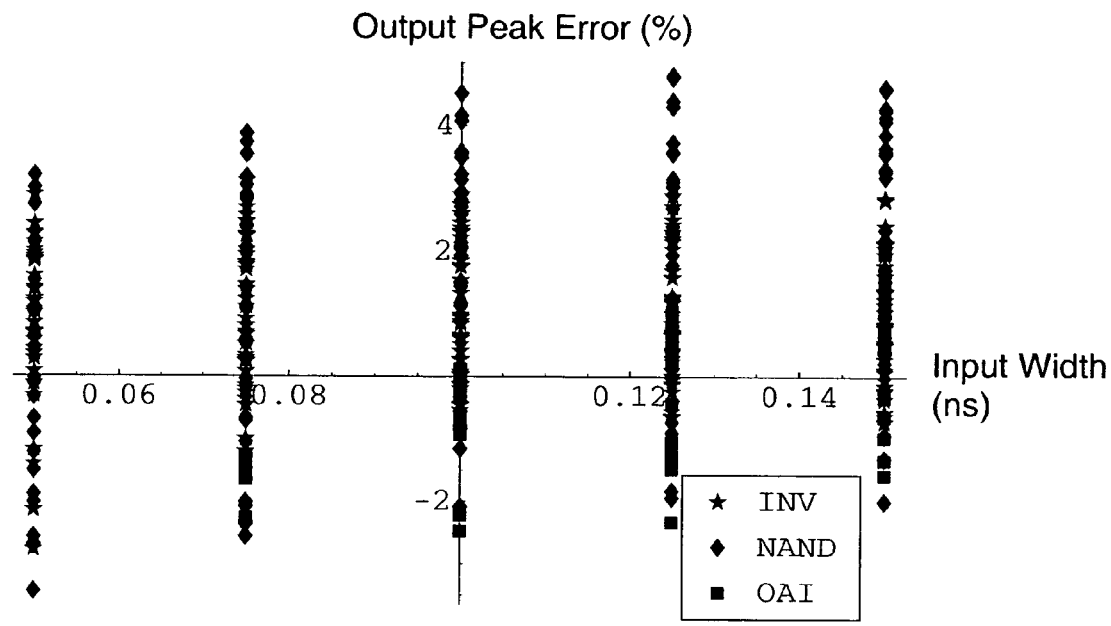
FIGS. 11A and 11B are sample simulation results of output peak errors with respect to input width and input peak respectively in accordance with some embodiments of the invention.
Figure 11B:
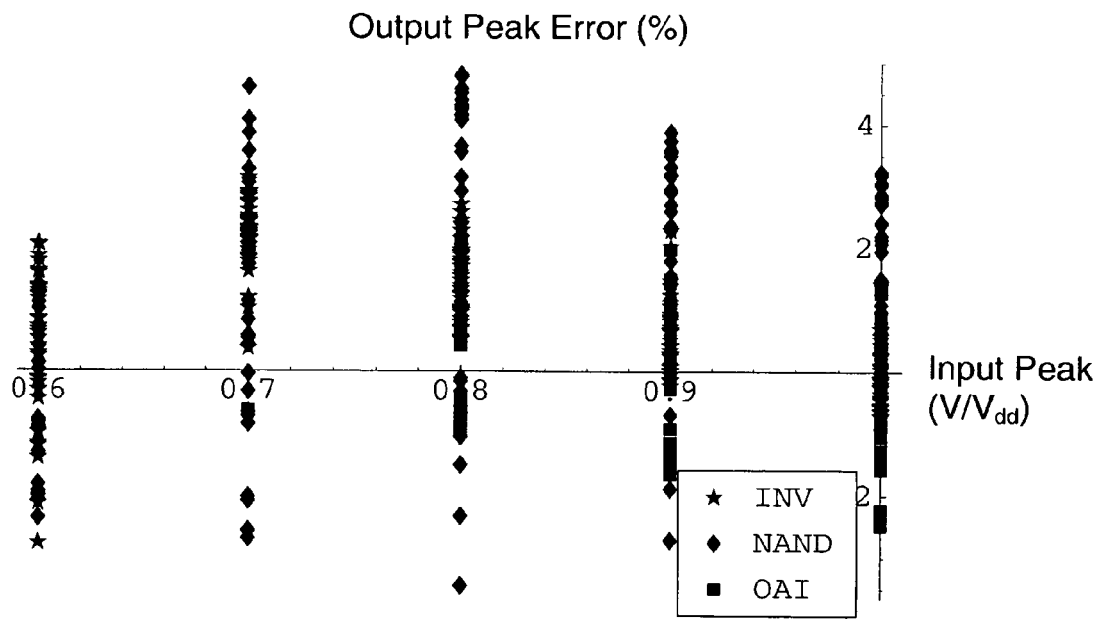

FIGS. 10A and 10B are sample simulation results of output area error versus input width and input peak, respectively, in accordance with some embodiments of the invention. Results for three different drivers are shown in three different legends of "star", "diamond", and "square". FIGS. 11A and 11B are sample results of output peak errors versus input width and input peak, respectively, in accordance with some embodiments of the invention, and FIGS. 12A and 12B are sample results of output area error in percentage versus output area and output peak error in percentage versus output peak, respectively, in accordance with some embodiments of the invention. It is evident from the results that the synthesized current source model performs robustly. Accuracy of glitch propagation is significantly improved as compared to the prior art.

Experiments were also made to find the worst case aggressor alignment and compare the results with those from SPICE based worst case alignment. The two (2) RLC extracted were excluded for this experiment as these nets didn't have significant coupling capacitances. For rest of the above mentioned test cases, variation were made to construct a comprehensive test suite as follows: (i) victim input slew rate for generating different victim receiver slew rates (ii) aggressor output slew rates for varying coupling noise width and height (iii) aggressor drive strengths for the same and (iv) the load capacitance of victim receiver.

Using SPICE simulation, aggressor transitions were swept within in a sufficiently large timing window around the victim transition to find the true maximum change in delay at the receiver output, whereas, for some embodiments of the invention the worst case change in delay at the receiver output was computed as explained in detail in FIG. 7. For each test case, the error in finding the stage delay due to alignment method of the present invention was measured by normalizing the difference between changes in delay and SPICE based changes in delay with respect to the SPICE based quiet aggressor delay at the receiver output. The maximum and average alignment error over all of the above mentioned parameters is presented in Table 2.

TABLE 2

| DRIVERS | NETS | ECSM MAX | ECSM AVG |
|---|---|---|---|
| INVX30 | Rc1 | −0.76 | 0.22 |
| | Rc2 | −1.06 | 0.43 |
| | Rc3 | 1.41 | 0.36 |
| | Rc4 | 6.56 | 2.59 |
| | Rc5 | 1.76 | 0.67 |
| NAND4X20 | Rc1 | −0.28 | 0.09 |
| | Rc2 | 1.40 | 0.45 |
| | Rc3 | 0.69 | 0.18 |
| | Rc4 | 6.13 | 3.46 |
| | Rc5 | 4.83 | 1.87 |
| OAIX10 | Rc1 | 1.40 | 0.80 |
| | Rc2 | 1.46 | 1.06 |
| | Rc3 | 2.84 | 1.64 |
| | Rc4 | 3.20 | 1.65 |
| | Rc5 | 3.17 | 2.29 |
| ALL NETS | | 6.56 | 1.18 |

FIG. 13 is a diagram illustration of a system adapted to synthesize a current source model according to one embodiment of the invention. System 1300 may be for example a computer system, and may include at least a memory device 1301 and a data processing unit 1302 which may execute instructions stored in memory device 1301. Memory device 1301 may include or store, for example, a cell library 1310 which contains data conforming to different data formats such as, for example, data format of CCSM and/or ECSM. Memory device 1301 may also include one or more netlists such as netlist 1320. According to one embodiment of the invention, memory device 1301 may store instructions or program codes that, when executed by a processing unit such as processing unit 1302, may conduct performance analysis of one or more netlists stored thereon, for example, netlist 1320. Data processing unit 1302 may execute one or more algorithms such as, for example, an algorithm 1311 for generating look-up table for output transient current, an algorithm 1312 for generating analytical current source model using, for example, a shifted and scaled hyperbolic tangent function, and an algorithm 1313 for analyzing alignment between different interfering cells or logic stages.

According to one embodiment of the invention, cell library 1310 and algorithms 1311, 1312, and 1313 may be stored or saved in a same memory device such as memory device 1301. However the invention is not limited in this respect, and cell library 1310 and algorithms 1311, 1312, and/or 1313 may be stored or saved in different memory devices.

According to embodiments of the invention, memory device 1301 may be a semiconductor memory device such as, for example, a random access memory (RAM) and/or a flash memory, an electro-magnetic memory device such as, for example, a floppy disk and/or a magnetic tape, and/or an optical memory device such as, for example, a compact disk (CD). However, the invention is not limited in this respect and a person skilled in the art will appreciate that other types of memory devices may be used.

According to embodiments of the invention, processing unit 1302 may be a central processing unit (CPU) of a data processing device such as a personal computer (PC), a personal data assistant (PDA), a work-station. However, the invention is not limited in this respect and a person skilled in the art will appreciate that other data processing unit may be used.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method for performing an analysis of at least one logic stage in a netlist, said logic stage having at least one driver, the method comprising:
   a) generating at least one look-up table for an output transient current, based on values of input and output voltages, using data available from a cell library;
   b) synthesizing analytically at least one current source model including a DC component and a plurality of parasitic capacitances, using said look-up table, said synthesizing said current source model including representing said DC component of said current source model using an analytical expression and curve-fitting said analytical expression to values of said output transient current available from said look-up table;
   c) simulating said logic stage using said current source model to model said driver; and
   d) obtaining characteristics of said simulated logic stage, wherein synthesizing said current source model further comprises computing values of said plurality of parasitic capacitances by curve-fitting said current source model to values of said output transient current available from said look-up table.

2. The method of claim 1, wherein said analytical expression is a hyperbolic tangent function, said curve-fitting to values of said output transient current comprises determining parameters defining said hyperbolic tangent function using nonlinear regression.

3. The method of claim 1, wherein obtaining characteristics comprises determining analytically a trans-conductance gain of said logic stage and identifying at least one condition of input and output voltages for reaching a pre-defined gain.

4. The method of claim 3, wherein said pre-defined gain is a maximum gain of said logic stage for a given input and output voltage range.

5. The method of claim 1, wherein obtaining characteristics comprises obtaining timing and noise characteristics of said simulated logic stage.

6. The method of claim 1, wherein generating said look-up table comprises:
   a) representing analytically said input and output voltages and output transient current, respectively, as functions of time;
   b) sampling said input and output voltages and output transient current at a pre-determined time interval;
   c) sorting sampled output transient current values based on sampled input and output voltage values; and
   d) re-sampling said output transient current at input and output voltage values of pre-defined intervals.

7. The method of claim 6, wherein representing said output transient current as a function of time comprises:
   a) curve-fitting data of said output voltage, available from said cell library, to a closed-form analytical equation;
   b) calculating a derivative of said closed-form analytical equation; and
   c) scaling said derivative to represent said output transient current.

8. The method of claim 7, wherein curve-fitting said output voltage comprises curve-fitting said output voltage to a Weibull cumulative distribution equation.

9. The method of claim 6, wherein representing said output voltage as a function of time comprises:
   a) curve-fitting data of said output transient current, available from said cell library, to a closed-form analytical equation;
   b) calculating an integration of said closed-form analytical equation; and
   c) scaling said integration to represent said output voltage.

10. The method of claim 9, wherein curve-fitting said output transient current comprises curve-fitting said output transient current to a quadratic equation.

11. The method of claim 1, wherein said cell library comprises current source model data conforming to a predefined format.

12. A non-transitory machine-readable medium having stored thereon a set of instructions that, when executed by a machine, result in:
   a) generating at least one look-up table for an output transient current, based on values of input and output voltages, using data available from a cell library;
   b) synthesizing analytically at least one current source model including a DC component and a plurality of parasitic capacitances, using said look-up table, said synthesizing said current source model comprises representing said DC component of said current source model using an analytical expression and curve-fitting said analytical expression to values of said output transient current available from said look-up table;
   c) simulating said logic stage using said current source model to model said driver; and
   d) obtaining characteristics of said simulated logic stage, wherein synthesizing said current source model further comprises computing values of said plurality of parasitic capacitances by curve-fitting said current source model to values of said output transient current available from said look-up table.

13. The non-transitory machine-readable medium of claim 12, wherein said analytical expression is a hyperbolic tangent function, said curve-fitting to values of said output transient current comprises determining parameters defining said hyperbolic tangent function using nonlinear regression.

14. The non-transitory machine-readable medium of claim 12, wherein obtaining characteristics comprises determining analytically a trans-conductance gain of said logic stage and identifying at least one condition of input and output voltages for reaching a pre-defined gain.

15. The non-transitory machine-readable medium of claim 14, wherein said pre-defined gain is a maximum gain of said logic stage for a given input and output voltage range.

16. The non-transitory machine-readable medium of claim 12, wherein generating said look-up table comprises:
   a) representing analytically said input and output voltages and output transient current, respectively, as functions of time;
   b) sampling said input and output voltages and output transient current at a pre-determined time interval;
   c) sorting sampled output transient current values based on sampled input and output voltage values; and
   d) re-sampling said output transient current at input and output voltage values of pre-defined intervals.

17. The non-transitory machine-readable medium of claim 16, wherein representing said output transient current as a function of time comprises:

a) curve-fitting data of said output voltage, available from said cell library, to a closed-form analytical equation;
b) calculating a derivative of said closed-form analytical equation; and
c) scaling said derivative to represent said output transient current.

18. The non-transitory machine-readable medium of claim 17, wherein curve-fitting said output voltage comprises curve-fitting said output voltage to a Weibull cumulative distribution equation.

19. The non-transitory machine-readable medium of claim 16, wherein representing said output voltage as a function of time comprises:

a) curve-fitting data of said output transient current, available from said cell library, to a closed-form analytical equation;
b) calculating an integration of said closed-form analytical equation; and
c) scaling said integration to represent said output voltage.

20. The non-transitory machine-readable medium of claim 19, wherein curve-fitting said output transient current comprises curve-fitting said output transient current to a quadratic equation.

* * * * *